United States Patent
Lamanna et al.

(10) Patent No.: US 8,508,271 B1
(45) Date of Patent: Aug. 13, 2013

(54) PHASE LOCKED LOOP

(75) Inventors: Pasquale Lamanna, Cannes (FR); Davide Orifiamma, Valbonne (FR)

(73) Assignee: Cambridge Silicon Radio Limited, Cambridge (GB)

(*) Notice: Subject to any disclaimer, the term of this patent is extended or adjusted under 35 U.S.C. 154(b) by 0 days.

(21) Appl. No.: 13/562,813

(22) Filed: Jul. 31, 2012

(51) Int. Cl.
*H03L 7/06* (2006.01)
(52) U.S. Cl.
USPC ............... 327/159; 327/236; 331/25; 331/34; 375/376
(58) Field of Classification Search
USPC ............... 327/156, 159, 147, 152, 157, 231, 327/232, 236, 243, 244; 375/373, 375–376; 331/25, 34
See application file for complete search history.

(56) References Cited

U.S. PATENT DOCUMENTS

| | | | |
|---|---|---|---|
| 8,330,510 B2 * | 12/2012 | Lamanna et al. | 327/156 |
| 2003/0012321 A1 * | 1/2003 | Tokutome et al. | 375/376 |

* cited by examiner

*Primary Examiner* — Long Nguyen
*Assistant Examiner* — Thomas Skibinski
(74) *Attorney, Agent, or Firm* — Lando & Anastasi, LLP

(57) ABSTRACT

A phase locked loop that includes a signal generator arranged to output a feedback signal, a first phase detector arranged to detect a phase difference between the feedback signal and a reference signal and to output a first phase detect signal in dependence on that detection, a second phase detector arranged to detect a phase difference between the feedback signal and a delayed version of the reference signal or between the reference signal and a delayed version of the feedback signal and to output a second phase detect signal in dependence on that detection, and an adjustor. The adjustor is arranged to determine which of the first and second phase detect signals commutes first and to alter the frequency of the feedback signal in dependence on the result of the determination.

23 Claims, 7 Drawing Sheets

PHASE LOCKED LOOP

The present invention relates to phase locked loops. The present invention is particularly useful when employed in a high frequency phase locked loop i.e. more than 10 GHz.

A phase locked loop (PLL) is a circuit that generates an output signal having a predetermined frequency and/or phase relationship with a reference signal. A PLL can be used in a communication device as part of a frequency multiplier, a demodulator, a tracking generator or a clock recovery circuit. A typical PLL is shown in FIG. 1.

The PLL shown in FIG. 1 comprises a phase detector 1 arranged to receive a reference signal a(t) and a feedback signal e(t). The phase detector 1 outputs a signal b(t) to filter 2. Filter 2 outputs signal c(t) to a oscillator 3. The oscillator outputs feedback signal e(t) to feedback loop 5 and to further processing circuitry (not shown).

A PLL may be an analogue PLL or a digital PLL. For analogue PLLs, the filter 2 may be a conventional analogue loop filter. For digital PLLs, the filter 2 may be a digital signal processor (DSP) configured to receive a digital signal quantising the phase difference between two signals and to output a control signal to a signal generator. Throughout the following, the term "filter" is used to encompass DSPs (or their functional equivalent) in a digital PLL.

The phase detector is arranged to determine a frequency or phase difference between reference signal a(t) and feedback signal e(t). In dependence on that determined difference, the phase detector outputs a signal b(t) to filter 2.

If the circuit performs analogue filtering, the signal b(t)) is commonly generated using charge pumps and comprises a series of pulses. Each pulse has an area that corresponds to the determined phase difference and so also quantifies the phase difference detected by phase detector 1. This analogue case is illustrated in FIGS. 2A and 2B.

FIG. 2A shows signals a(t), b(t) and e(t) in a first embodiment of the conventional case in which there is a small offset in phase between the feedback signal e(t) and the reference signal a(t). In this embodiment, signal b(t) output by the phase detector 1 is formed of a series of narrow pulses each having an area A.

FIG. 2B shows signals a(t), b(t) and e(t) in a second embodiment of the conventional case in which there is a larger offset in phase between the feedback signal e(t) and the reference signal a(t) than in the first embodiment. In this second embodiment, signal b(t) output by the phase detector 1 is again formed of a series of pulses. However, as there is a larger offset in to phase difference in this embodiment compared to the first embodiment described above, these pulses are wider than those shown in FIG. 2A. Therefore, the pulses of b(t) shown in FIG. 2B have an area of A', where A'>A.

The pulses b(t) are passed to the filter 2. Filter 2 is commonly a loop filter in this analogue embodiment. Filter 2 is arranged to integrate signal b(t), which results in a signal c(t) that is proportional to the area A, A' of the pulses. This integrated signal c(t) can be used to control the oscillator 3.

If the circuit performs digital filtering, signal b(t) is commonly a stream code (of 1 bit and/or of nbits) that quantifies the phase difference detected by phase detector 1. The stream code b(t) output by the phase detector 1 is output to a filter 2. Although the term "filter" is used, filter 2 in the digital case is more accurately described as a signal processing circuit. However, for consistency with the analogue case, the term "filter" will be employed throughout the following. Filter 2 generates an output signal c(t) to a oscillator 3. The output signal c(t) instructs the oscillator 3 how to alter its frequency in dependence on the detected phase difference.

A common goal of a PLL is to achieve a "locked" state. In this state, the determined phase difference between the feedback signal e(t) and the reference signal a(t) is substantially constant (within the tolerances of the PLL). The constant phase difference can have a zero or non-zero value depending on the type of PLL. In practice, it is difficult to achieve a perfect locked state as the tolerance of the phase detector 1 limits the accuracy of the locking mechanism.

A PLL can synthesize different output frequencies using a feedback loop comprising an integer N divider. An example of an integer N divider PLL is shown in FIG. 3.

In FIG. 3, a phase detector 1 is arranged to receive a reference signal a(t) and a divided oscillator signal e(t). The phase detector 1 outputs a signal b(t) to filter 2. After filtering signal b(t), the filter 2 outputs signal c(t) to a oscillator 3. The oscillator outputs signal d(t). Signal d(t) is passed to a divider 4 in a feedback loop 5 and to further processing circuitry (not shown). Divider 4 passes feedback signal e(t) to phase detector 1.

The phase detector 1 is arranged to compare the reference signal a(t) with a feedback signal e(t). In this case, the feedback signal e(t) is output by divider 4 located in feedback loop 5. The reference signal a(t) could be output by an oscillator. The signal b(t) output by the phase detector 1 is representative of the phase difference between the feedback signal e(t) and the reference signal a(t). As mentioned above, the signal b(t) quantises the phase difference between two signals input to the phase detector. Depending on whether the phase detector 1 is a digital or analogue phase detector, signal b(t) can take the form of a stream code or of a modulated width pulse respectively. Signal b(t) is passed to filter 2. Filter 2 outputs a signal c(t) that is indicative of whether the frequency of the oscillator 3 needs to be increased or decreased.

Having divider 4 in the feedback loop 5 enables the PLL to synthesize a range of different frequencies without altering the reference signal. To generate a different frequency, the divider 4 changes the value of the integer N by which it divides signal d(t). In this way, the same PLL may be used to synthesize different frequencies for transmitting and receiving a signal in a transceiver.

A PLL may achieve a locked state by measuring the frequency of the signal output by oscillator 3 and correcting for an offset from a desired frequency using digital information. However, this requires either a divider in the acquisition path that is different to the divider in the feedback loop or a frequency detector after the divider in the feedback loop. Also, measuring the frequency of the signal output by oscillator 3 requires a long measurement period in order to ensure a good resolution. Further, the gain of the oscillator 3 needs to be considered in order to minimise the offset. This can add to the time taken to achieve a locked state.

There is therefore a need for a PLL that addresses at least one of these issues.

SUMMARY

According to a first aspect of the present invention, there is provided a phase locked loop, comprising; a signal generator arranged to output an feedback signal, a first phase detector arranged to detect a phase difference between the feedback signal and a reference signal and to output a first phase detect signal in dependence on that detection, a second phase detector arranged to detect a phase difference between the feedback signal and a delayed version of to the reference signal or between the reference signal and a delayed version of the feedback signal and to output a second phase detect signal in dependence on that detection; and an adjustor arranged to determine which of the first and second phase detect signals commutes first and to alter the frequency of the feedback signal in dependence on the result of the determination.

When the second phase detect signal indicates a phase difference between the feedback signal and a delayed version of the reference signal, the adjustor may be arranged to increase the frequency of the feedback signal when the adjustor determines that the first phase detect signal commutes first and to decrease the frequency of the feedback signal when the adjustor determines that the second phase detect signal commutes first.

When the second phase detect signal indicates a phase difference between the reference signal and a delayed version of the feedback signal and the adjustor may be arranged to decrease the frequency of the feedback signal when the adjustor determines that the first phase detect signal commutes first and to increase the frequency of the feedback signal when the adjustor determines that the second phase detect signal commutes first.

The adjustor may be arranged to determine which of the first and second phase detect signals commutes first by identifying a state in which the first and second phase detect signals are equal and by identifying which of the first and second phase detect signals is the first to commute from that state. The adjustor may be arranged to sample a respective sequence of values output by the first and second phase detectors in order to identify when the first and second phase detect signals are equal.

The adjustor may be arranged to determine which of the first and second phase detect signals commutes first by examining respective sequences of commutations of the first and second phase detect signals.

The adjustor may be further arranged to assert a lock signal for locking the phase locked loop when the adjustor determines that the frequency of the feedback signal has sequentially increased and decreased a predetermined number of times.

The phase locked loop may further comprise an integral filter path arranged to either increase or decrease the frequency of the feedback signal in dependence on an output from the adjustor. The integral filter path may be arranged to receive the lock signal. The output from the adjustor may be dependent on which phase signal commuted first.

The phase locked loop may further comprise a proportional filter path arranged to receive the first phase detect signal and to control the frequency of the feedback signal in dependence thereon.

The phase of the delayed version of the reference signal may be offset from the phase of the feedback signal by less than 180 degrees.

The adjustor may further comprise memory cells arranged to detect when the first and second phase detect signals commute.

The phase locked loop may be arranged to operate at a frequency higher than 10 GHz.

The first phase detector may be a binary phase detector.

The second phase detector may be a binary phase detector.

The signal generator may be a voltage controlled oscillator or a digitally controlled oscillator.

The phase locked loop may further comprise a feedback path having an integer-N divider.

According to a second aspect of the present invention, there is provided a method for altering the frequency of a feedback signal comprising the steps of detecting a phase difference between the feedback signal and a reference signal and outputting a first phase detect signal in dependence on that detection, detecting a phase difference between the feedback signal and a delayed version of the reference signal or between the reference signal and a delayed version of the feedback signal and outputting a second phase detect signal in dependence on that detection, determining which of the first and second phase detect signals commutes first, and altering the frequency of the feedback signal in dependence on the result of the determining step.

The method may further comprise the steps of decreasing the frequency of the feedback signal if the adjustor determines that the first phase detect signal commutes first and increasing the frequency of the feedback signal if the adjustor determines that the second phase detect signal commutes first.

The method may further comprise the steps of determining that the frequency of the feedback signal has sequentially increased and then decreased a predetermined number of times and asserting a lock signal as a result of this determination.

The method may be arranged such that the frequency of the feedback signal is only altered when no lock signal is being asserted.

The step of determining which of the first and second phase detect signals commutes first may include the steps of identifying a state in which the first and second phase detect signals are equal and identifying which of the first and second phase detect signals is the first to commute from that state.

DESCRIPTION

Figure 1:
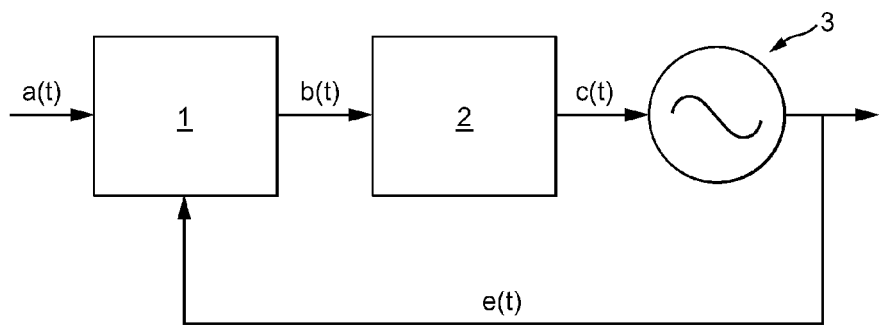
FIG. 1 shows a conventional PLL.
Figure 2A:
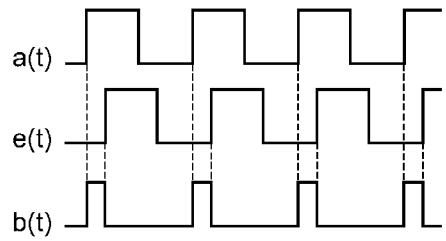
FIGS. 2A and 2B demonstrate the difference in output of an analogue phase detector when the feedback signal e(t) lags the reference signal a(t) by different amounts.
Figure 2B:
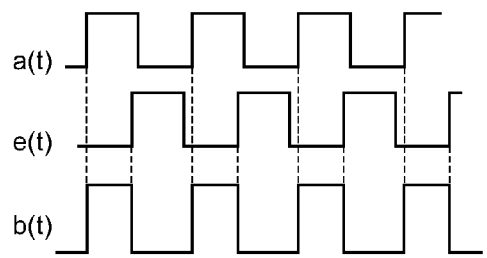
Figure 3:
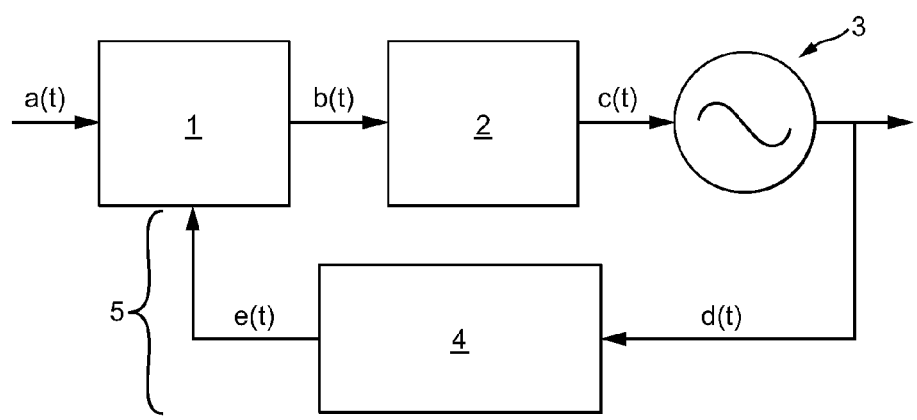
FIG. 3 shows an integer PLL.

The present invention relates to a PLL comprising a signal generator arranged to output a feedback signal. The signal generator could comprise an oscillator, such as a digitally controlled oscillator or a voltage controlled oscillator. Alternatively, the signal generator could comprise both an oscillator and a divider in the feedback path.

The PLL further comprises two phase detectors. One of the phase detectors is arranged to receive a reference signal and the feedback signal and to detect a phase difference between those two signals. The other phase detector is arranged to receive the feedback signal and a delayed version of the reference signal or to receive the reference signal and a delayed version of the feedback signal and to detect a phase difference between those two signals received by the other phase detector.

Each phase detector outputs a phase detect signal to an adjustor in dependence on their respective detected phase difference. The phase detect signal output by a phase detector indicates at least one property of a detected phase difference between the two signals input to that phase detector. The adjustor is arranged to determine which phase detect signal commutes first and to alter the frequency of the feedback signal in dependence on that determination.

To detect which phase detect signal commutes first, the adjustor may examine respective sequences of commutations in each phase detect signal. Following such examination, the adjustor may compare each detected sequence to a decision table comprising a plurality of pre-stored sequences. The decision table may be used by the adjustor to decide whether to increase or decrease the frequency of the feedback signal.

The PLL described above may be arranged to achieve a locked state without needing either a frequency counter or a high range time to digital converter for detecting the amplitude of to phase variation in the input signal at high frequencies. This reduces the complexity of the circuit over known prior art PLLs. Also, the described PLL enables an architecture that does not directly use a high frequency feedback clock to detect frequency error inputs. Thus the output clock performance may be improved. Furthermore, the described PLL enables a locked state to be achieved faster than the prior art scenario mentioned in the background section in which the frequency of the feedback signal is measured over time.

For clarity, the following describes various embodiments of the present invention in terms of those cases in which the second phase detector is configured to receive the feedback signal and the delayed version of the reference signal. However, corresponding embodiments can be similarly described for those cases in which the second phase detector is instead configure to receive the reference signal and the delayed version of the reference signal. Thus the following should be read as covering both of these embodiments.

The delayed version of the reference signal may be formed in at least two different ways. The reference signal may be passed through a delay to form a delayed version of itself. Alternatively, the PLL may comprise additional circuitry arranged to generate a delayed version of the reference circuitry. The delayed version of the reference signal is a signal that is substantially identical to the reference signal, except for being offset in time by a time $t_2$. As the delayed version of the reference signal is a version of the reference signal, it has the same identifying characteristics as the reference signal (except for being offset in time).

The adjustor may be arranged to alter the frequency of the feedback signal by issuing a frequency control signal indicating whether the frequency of the feedback signal should be increased or decreased. The frequency control signal may have two states that represent up and down respectively. In this case, the frequency control signal can be increased or decreased by a predetermined amount. Alternatively, the frequency control signal may have multiple states for indicating both whether the frequency of the feedback signal needs to be increased or decreased and also the amount by which the feedback signal needs to be increased or decreased.

Preferably the phase detectors are very simple phase detectors that have two states: an early detect state and a late detect state. It is uncommon to implement such phase detectors in high frequency digital PLLs (i.e. where the frequency of the output signal is >10 Ghz) as clock to data recovery in digital PLLs is very simple and is limited in phase discrimination. As such detectors are limited in phase discrimination, this limits the frequency capture range of the PLL. The presently described techniques can be implemented in a PLL having a low frequency reference clock. The presently described techniques can be implemented in a PLL having a high frequency reference clock Preferably, the phase detectors are binary phase detectors (BPDs). BPDs are simple and inexpensive to implement in the PLL circuit. For example, each BPD may be implemented using flip-flops.

The commutations in the phase detect signals can be detected using two memory cells for each phase detect signal. A memory cell has two states, 0 and 1. The use of memory cells for detecting commutations is particularly useful when BPDs are used for the phase detectors as a memory cell flips between two different states when triggered by a predetermined event i.e. up or down. However, any known means for detecting commutations can be used to detect commutations in the phase detect signal.

The output of each BPD may be read on every rising edge of that respective BPD's version of the reference signal.

Preferably, once the PLL has entered a locked state, the adjustor is arranged to assert a lock signal. When the lock signal is asserted, the frequency of the feedback signal is no longer altered in response to detected commutations in the phase detect signals output by the phase detectors. The lock signal may be asserted when the adjustor tries to sequentially increase and then decrease the frequency of the signal a predetermined number of times in a row. For example, if the frequency control signal has two states, 1 or 0, then "1" could represent a command to increase the frequency and "0" could represent a command to decrease the frequency. If the frequency control signal FREQ_CTRL has a pattern of 01010101, i.e. 8 adjacent values are different, the frequency control signal is said to have sequentially increased and decreased the frequency of the feedback signal 7 times. There have also been seven instructions to the signal generator to change from an "increasing frequency" state to a "decreasing frequency state" and vice versa i.e. from "1" to "0" and vice versa. If the frequency control signal FREQ_CTRL has a pattern of 01110101 i.e. there are 4 adjacent values that are different, then the frequency control signal is said to have sequentially to increased and decreased the frequency of the feedback signal 3 times. However, in this later case, there have been four instructions to the signal generator to change from an "increasing frequency" state to a "decreasing frequency state" and vice versa i.e. from "1" to "0" and vice versa.

The lock signal may be only internal to the adjustor. Alternatively, the lock signal could be output to further circuitry in the PLL.

When a locked signal has been asserted, the PLL is arranged so that only the phase detector arranged to receive the feedback signal and the reference signal controls the frequency of the signal generator.

When employed in PLLs arranged to synthesize a high frequency feedback signal, the above described PLL does not require a high specification time to digital converter and delay buffer that are normally required by high frequency PLLs. Suitably, the feedback signal has a frequency of more than 10 GHz. Preferably, the feedback signal has a frequency of 12 GHz.

An integer PLL is a PLL that does not comprise a fractional-N divider in the feedback loop. The above described arrangement may be employed in a PLL that does not comprise a divider in the feedback loop at all. The above described arrangement may also be employed in a PLL that does comprise a divider in the feedback loop.

An embodiment of the present invention comprises two binary phase detectors (BPD). One of the BPDs is configured to receive the reference signal and the feedback signal and to output a phase detect signal having a value that is dependent on a detected phase difference between those two signals. The other of the BPDs is configured to receive the feedback signal and a delayed version of the reference signal and to output a phase detect signal having a value that is dependent on a detected phase difference between those two signals. The value of the signal output by the BPD may be "0" or "1". These values represent whether the detected phase difference between two signals input to a BPD is positive or negative. Throughout the following, "0" represents a negative phase difference between the two signals whilst "1" represents a positive phase difference between the two signals. However, the BPD could be configured so that the reverse is true.

The decision on whether the frequency of the signal output by the signal generator needs to be increased or decreased to achieve a locked state can be made in dependence on the sequence in which the values output by the BPDs commute. In particular, if the feedback signal lags the reference signal (i.e. the frequency of the signal output by the signal generator needs to be increased) then the signals output by the two BPDs change as follows:

| Clock Value | BPD1 (feedback signal and reference signal) | BPD2 (feedback signal and delayed reference signal) |
| --- | --- | --- |
| 1 | 1 | 0 |
| 2 | 1 | 1 |
| 3 | 0 | 1 |
| 4 | 0 | 0 |
| 5 | 1 | 0 |

In other words, when the frequency of the signal output by the signal generator needs to be increased, BDP1 outputs a value indicating a transition between positive and negative phase differences before BPD2 outputs a value indicating a corresponding transition.

In contrast, when the feedback signal leads the reference signal (i.e. the frequency of the signal output by the signal generator needs to be decreased) then the signals output by the two BPDs change as follows:

| Clock Value | BPD1 (feedback signal and reference signal) | BPD2 (feedback signal and delayed reference signal) |
| --- | --- | --- |
| 1 | 0 | 1 |
| 2 | 1 | 1 |
| 3 | 1 | 0 |
| 4 | 0 | 0 |
| 5 | 0 | 1 |

In other words, when the frequency of the signal output by the signal generator needs to be decreased, BDP2 outputs a value indicating a transition between positive and negative phase differences before BPD1 outputs a value indicating a corresponding transition.

Thus by examining the sequence of values output by BPD1 and BPD2, a state machine can determine whether the frequency of the signal output by the signal generator needs to be increased or decreased in order to achieve a locked condition.

Figure 4:
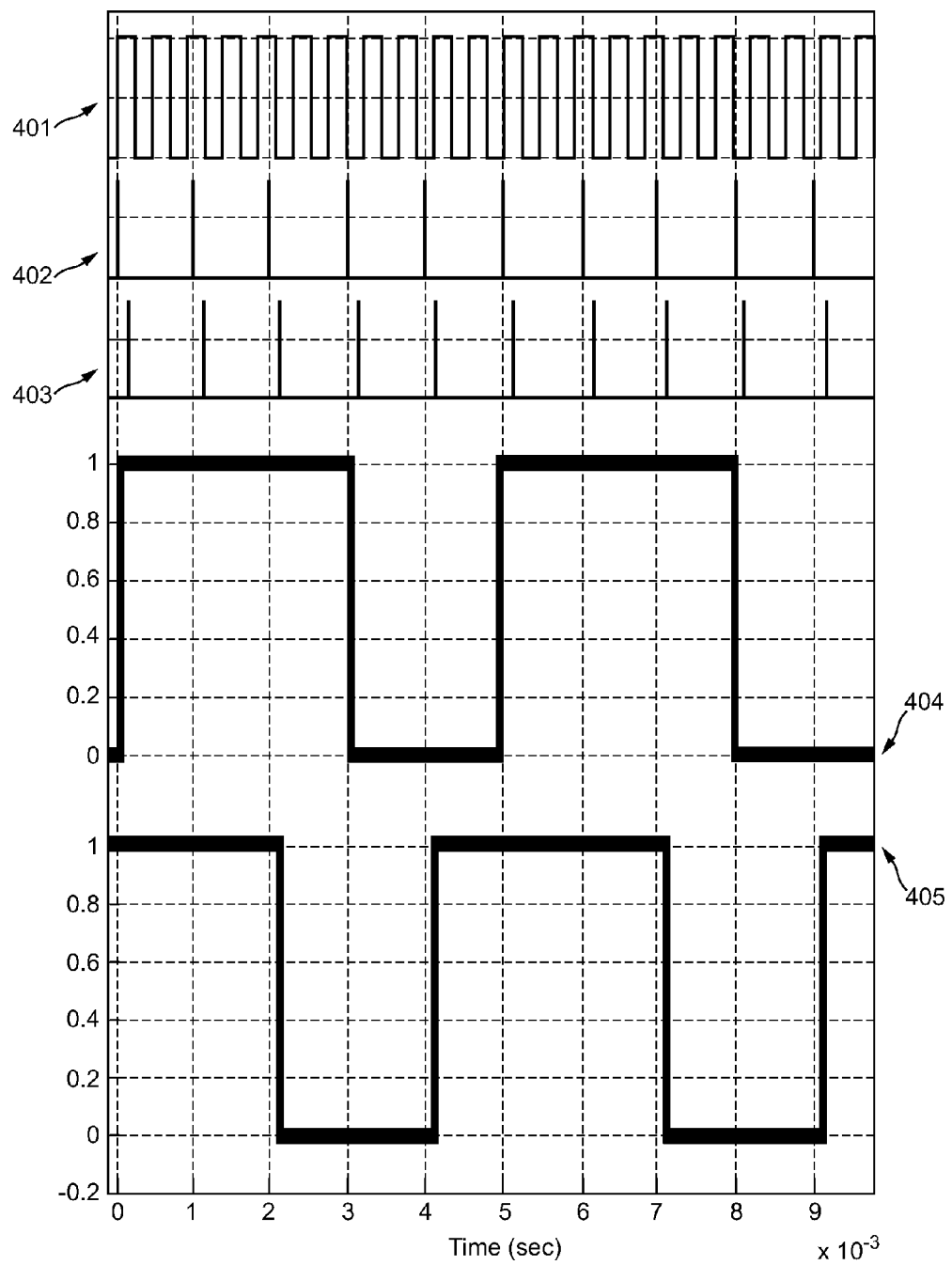
FIG. 4 shows the feedback signal, reference signal, delayed reference signal and the outputs from two phase detectors when the oscillating signal lags the reference signal.
Figure 5:
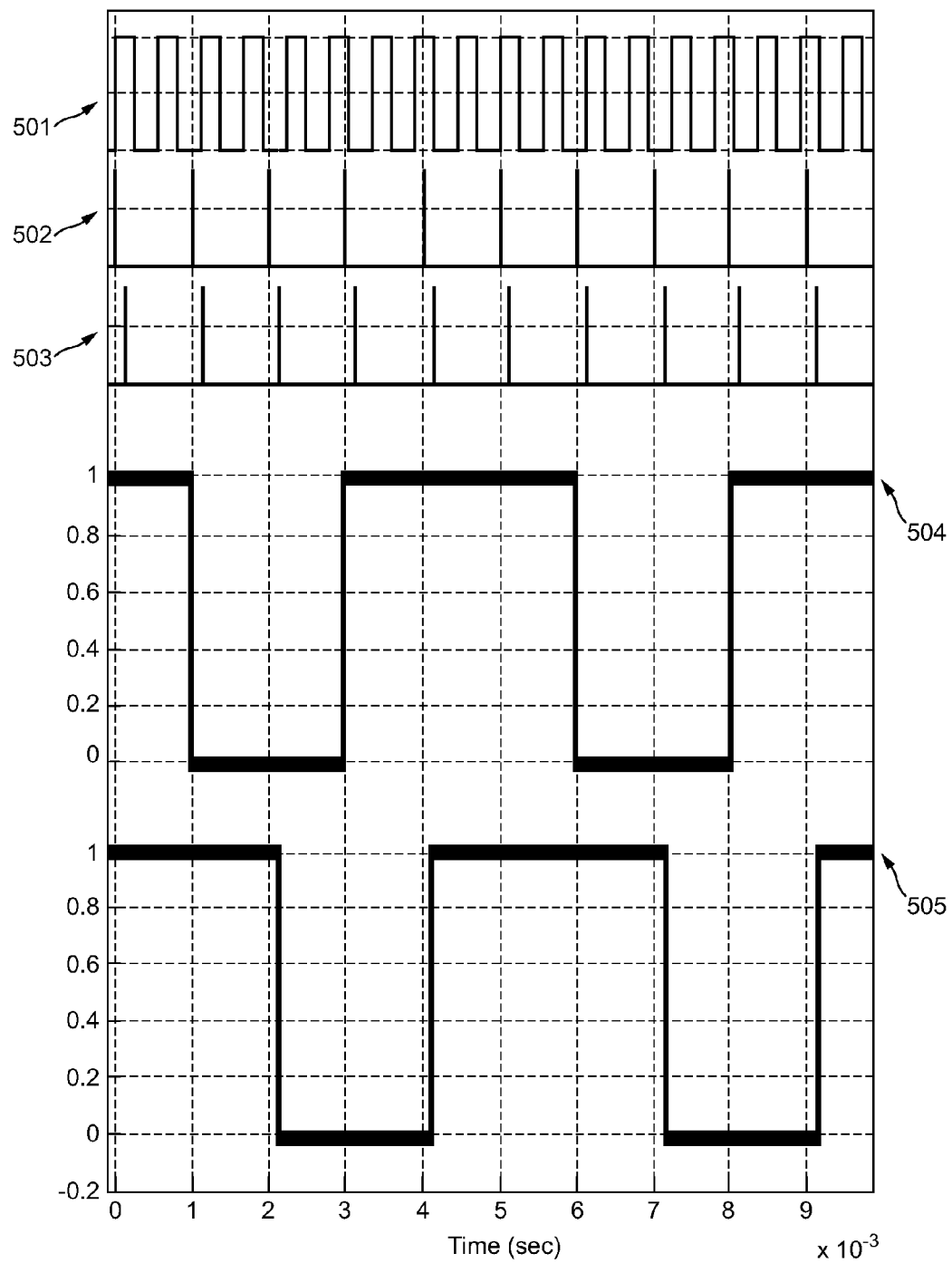
FIG. 5 shows the feedback signal, reference signal, delayed reference signal and the outputs from two phase detectors when the oscillating signal leads the reference signal.

FIGS. 4 and 5 illustrate possible forms of the feedback signal, the reference signal, the delayed reference signal and the outputs of BPD1 and BDP2.

In FIG. 4, the frequency of the feedback signal 401 is more than twice that of the reference frequency signal 402. The feedback signal 401 is leading the reference signal 402 and so the frequency of the feedback signal 401 should be decreased. BPD1 and BPD2 are each arranged to output either "1" or "0" depending on whether a positive or negative phase difference is measured. For simplicity, the reference frequency signal 402 and delayed reference frequency signal 403 are modelled as a series of delta pulses. Each delta pulse represents the time of a rising edge of that signal. The outputs of BPD1 and BPD2 are sampled at their respective delta pulses.

BPD1 output 404 indicates the output of a BPD arranged to receive the feedback signal 401 and the reference signal 402 and to output either "1" or "0" depending on the detected phase difference between those two signals.

BPD2 output 405 indicates the output of a BPD arranged to receive the feedback signal 401 and the delayed reference signal 403 and to output either "1" or "0" depending on the detected phase difference between those two signals.

As is evident from BPD1 output 404 and BPD2 output 405, BPD2 output 405 commutes before BPD1 output 404. In other words, when BPD1 and BPD2 are both outputting the same state (either "0" or "1"), BPD2 changes value first (i.e. from "0" to "1" or from "1" to zero"). BPD2 commutating first indicates that the feedback signal is leading the reference signal 402 and so the frequency of the feedback signal 401 needs to be decreased.

In contrast, in FIG. 5 the frequency of the feedback signal 501 is less than twice that of the reference signal 502. The feedback signal 501 is lagging the reference signal 502 and so the frequency of the feedback signal 501 should be increased. BPD1 and BPD2 are each arranged to output either "1" or "0" depending on whether a positive or negative phase difference is measured. For simplicity, the reference frequency signal 502 and delayed reference frequency signal 503 are modelled as a series of delta pulses. Each delta pulse represents the time of a rising edge of that signal. The outputs of BPD1 and BPD2 are sampled at their respective delta pulses.

BPD1 output 504 indicates the output of a BPD arranged to receive the feedback signal 501 and the reference signal 502 and to output either "1" or "0" depending on the detected phase difference between those two signals.

BPD2 output 505 indicates the output of a BPD arranged to receive the feedback signal 501 and the delayed reference signal 503 and to output either "1" or "0" depending on the detected phase difference between those two signals.

As is evident from BPD1 output 504 and BPD2 output 505, BPD1 output 504 commutes before BPD2 output 505. In other words, when BPD1 and BPD2 are both outputting the same state (either "0" or "1"), BPD1 changes value first (i.e. from "0" to "1" or from "1" to zero"). BPD1 commutating first indicates that the feedback signal is lagging the reference signal 502 and so the frequency of the feedback signal 501 needs to be increased.

A similar diagram can be drawn for the case where BPD2 is arranged to receive the reference signal and a delayed version of the feedback signal instead of the feedback signal and a delayed version of the reference signal. The only difference between this case and the embodiments described above in relation to FIGS. 4 and 5 is that the decision of whether to increase or decrease the frequency of the feedback signal is reversed. In the case where BPD2 is arranged to receive the reference signal and a delayed version of the feedback signal and the feedback signal lead the reference signal, BPD1 commutes first. This commutation thus indicates that the frequency of the feedback signal 401 needs to be decreased. Also in the case where BPD2 is arranged to receive the reference signal and a delayed version of the to feedback signal and the feedback signal is lagging the reference signal, BPD2 commutes first. This commutation thus indicates that the frequency of the feedback signal 501 needs to be increased.

Figure 8B:
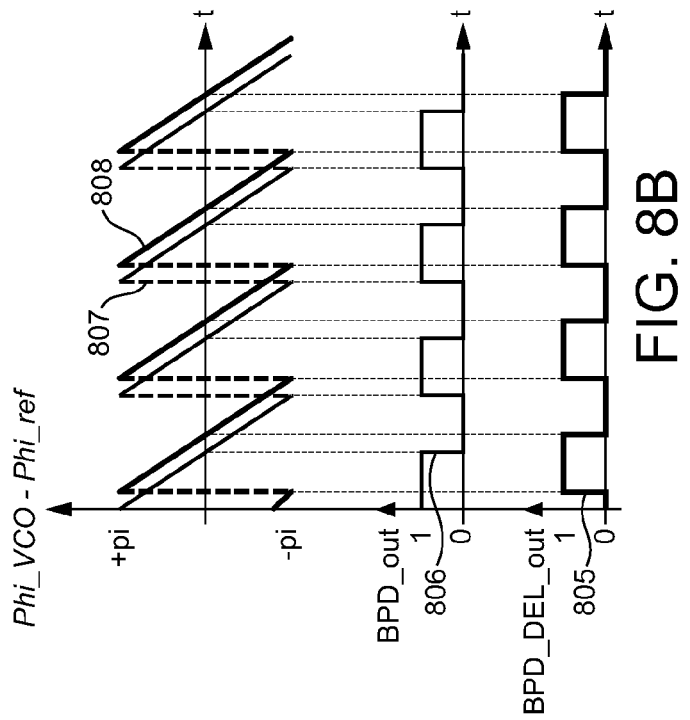
FIGS. 8A and 8B demonstrate the difference in output by a phase detector when the feedback signal e(t) lags the reference signal a(t) and when the feedback signal e(t) leads the reference signal.
Figure 8A:
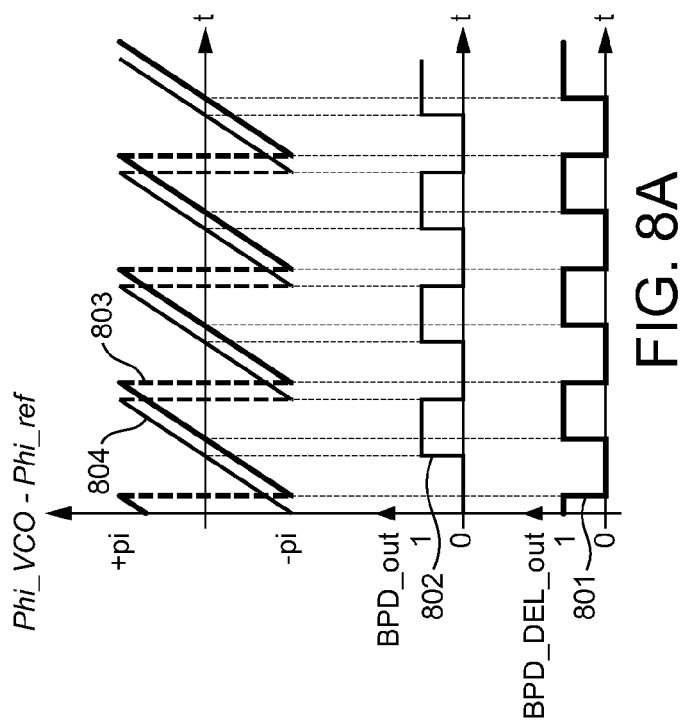

FIGS. 8A and 8B also illustrate the case when the phase detectors are both BPDs. Commutations in the phase detect signals can be detected by looking at the time at which the phase difference between the feedback signal and the respective reference signal is zero.

The signal shown at 801 in FIG. 8A is representative of the phase difference between the delayed version of the reference signal and the feedback signal as output by a binary phase detector. The signal shown at 803 is representative of the phase difference between the feedback signal and the delayed version of the reference signal. The signal shown at 802 in FIG. 8A is representative of the phase difference between the reference signal and the feedback signal as output by a binary phase detector. The signal shown at 804 is representative of the phase difference between the reference signal and the feedback signal.

In the example shown in FIG. 8A, the phase difference between the reference signal and the feedback signal commutes before the phase difference between the delayed version of the reference signal and the feedback signal. Therefore the feedback signal leads the reference signal and so the frequency of the feedback signal needs to be decreased.

The signal shown at 805 in FIG. 8B is representative of the phase difference between the delayed version of the reference signal and the reference signal as output by a binary phase detector. The signal shown at 808 is representative of the phase difference between the feedback signal and the delayed version of the reference signal. The signal shown at 806 in FIG. 8A is representative of the phase difference between the reference signal and the feedback signal as output by a binary phase detector. The signal shown at 807 is representative of the phase difference between the reference signal and the feedback signal.

In the example shown in FIG. 8B, the phase difference between the delayed version of the reference signal and the feedback signal commutes before the phase difference between the reference signal and the feedback signal. Therefore the feedback signal lags the reference signal and so the frequency of the feedback signal needs to be increased.

The invention will now be further elaborated with reference to specific embodiments.

Figure 6:
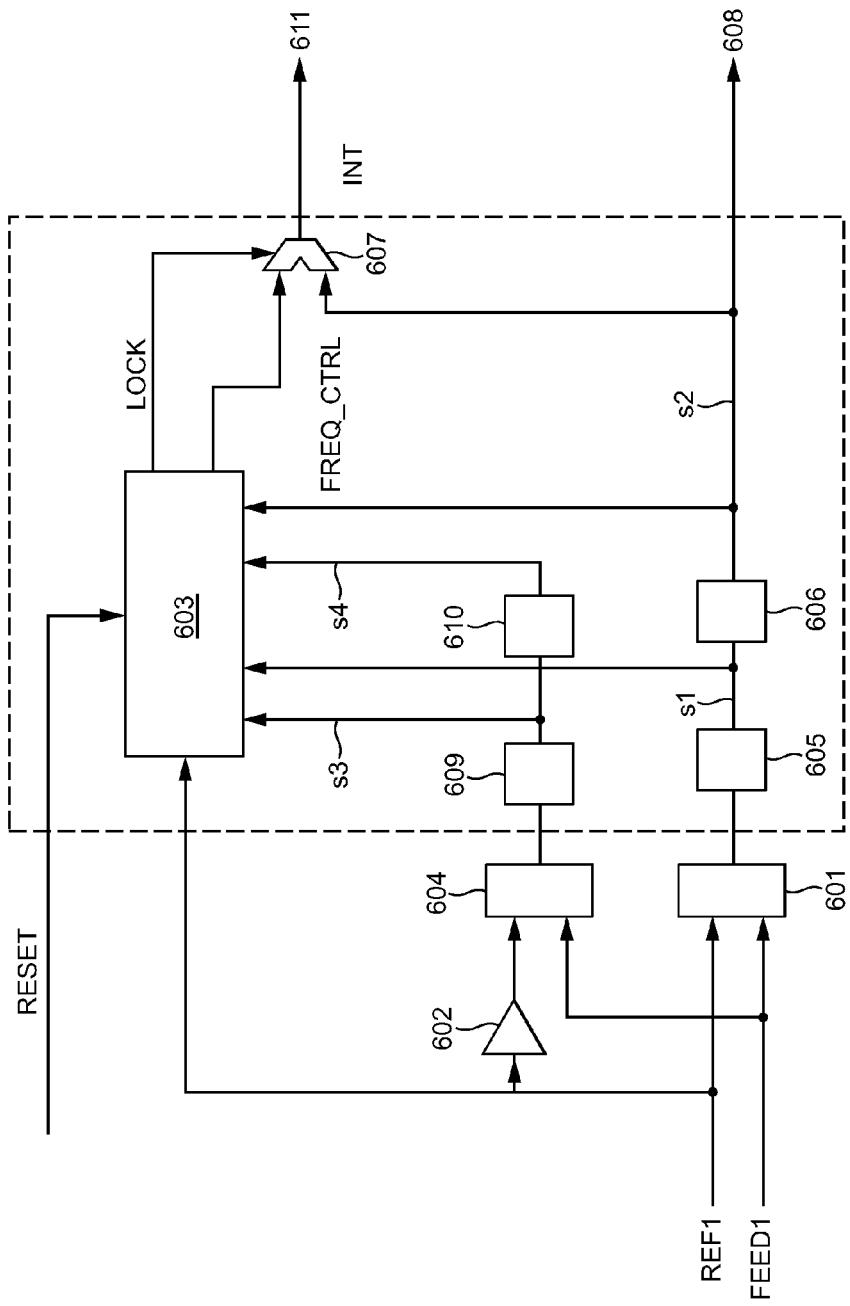
FIG. 6 shows a preferred embodiment of the present invention.

FIG. 6 illustrates a preferred embodiment of the present invention. Phase detector 601 receives feedback signal FEED1 and reference signal REF1 and outputs phase detect signal PD1. Phase detect signal PD1 is passed to memory cell 605. Memory cell 605 outputs signal s1 to adjustor 603 and memory cell 606. Memory cell 606 outputs signal s2 to the adjustor 603, to a proportional filter path 608 and to state machine 607. Reference signal REF1 is also fed to delay 602 and adjustor 603. Delay 602 outputs signal REF1$_{del}$. Phase detector 604 receives REF1$_{del}$ and feedback signal FEED1 and outputs phase detect signal PD2. Phase detect signal PD2 is passed to memory cell 609. Memory cell 609 outputs signal s3 to adjustor 603 and memory cell 610. Memory cell 610 outputs signal s4 to the adjustor 603. The adjustor 603 outputs frequency control signal FREQ_CTRL to state machine 607. State machine 607 outputs signal INT to an integral filter path.

State machine 607 may be implemented as a simple multiplexor.

Phase detector 601 receives a feedback signal FEED1 and reference signal REF1 and detects a phase difference between FEED1 and REF1. Based on this detected difference, phase detector 601 outputs a phase detect signal PD1 to memory cell 605. Memory cell 605 outputs a signal s1 to memory cell 606. Together, memory cells 605 and 606 output signals s1 and s2 that are indicative of when the phase detect signal PD1 has changed value. Memory cells 605 and 606 also perform the functionality of a two stage finite impulse response digital filter. Signals s1 and s2 are received by adjustor 603 and are used to determine when the phase detect signal of PD1 has commuted.

Phase detector 604 also receives feedback signal FEED1. However, instead of receiving reference signal REF1, phase detector 604 receives a delayed version of the reference signal REF1$_{del}$ which is formed by passing reference signal REF1 through a delay 602. Phase detector 604 is arranged to detect a phase difference between FEED1 and REF1$_{del}$. Based on this detected difference, phase detector 604 outputs a phase detect signal PD2 to memory cell 609. Memory cell 609 outputs a signal s3 to memory cell 610. Together, memory cells 609 and 610 output signals s3 and s4 that are indicative of when the phase detect signal PD2 has changed value. Signals s3 and s4 are received by adjustor 603 and are used to determine when the phase detect signal PD2 has commuted.

Adjustor 603 is arranged to receive the reference signal REF1 and signals s1, s2, s3 and s4 from memory cells 605, 606, 609 and 610 respectively and to determine which phase detect signal, PD1 or PD2 commutes first. In dependence on that determination, adjustor 603 will assert a frequency control signal FREQ_CTRL. Suitably, the frequency control signal FREQ_CTRL indicates whether the frequency of the feedback signal should be increased or decreased in order to achieve the desired frequency. Preferably, the frequency control signal has a value of 1 when the frequency of the feedback signal is increased and has a value of 0 when the frequency of the feedback signal is decreased. The frequency control signal FREQ_CTRL is received by state machine 607. State machine 607 also receives signal s2 output by memory cell 606. Signal S2 is indicative of a commutation in the value of phase detect signal PD1. State machine 607 outputs a signal INT towards an integral filter path of the circuit (not shown). The signal INT output by the state machine is used to change the frequency of the feedback signal by plus or minus an integer amount. The integer amount may be predetermined. The integer amount may be determined by the state machine 607.

Preferably, as shown in FIG. 6, the PLL includes a locked state mechanism for entering a locked-state. In FIG. 6, this is implemented in the adjustor. The adjustor is arranged to determine whether or not the frequency control signal FREQ_CTRL has sequentially changed value a predetermined number of times as described above.

If the adjustor determines that the frequency control signal FREQ_CTRL has sequentially changed value a predetermined number of times or more, the adjustor asserts a lock signal LOCK which is received by the state machine 607. On receiving the lock signal LOCK, state machine 607 is configured to stop instructing the integral filter path to increase or decrease the frequency of the feedback signal by a predetermined amount. This could be done in several ways. For example, state machine 607 could be configured to output a signal having at least three different states. One state could represent a command to increase the frequency of the feedback signal. Another state could represent a command to decrease the frequency of the feedback signal. Finally, a third state could represent a command to stop altering the frequency of the feedback signal.

The adjustor may also be configured to receive a lock reset signal RESET. Assuming that the adjustor counts the number of sequential changes in the value of the frequency control signal to FREQ_CTRL as described above, the lock reset signal RESET may be used to reset the counted number of sequential changes in the value of the frequency control signal FREQ_CTRL to zero.

When a lock signal is asserted, the PLL is arranged to use only information from the phase detector 601 to control the frequency of the feedback signal. In other words, the phase detector 604 that receives the feedback signal and a delayed version of the reference signal no longer effects a change in the frequency of the feedback signal. Instead, the frequency of the feedback signal can be controlled by transmitting signal s2 from memory cell 606 to a proportional filter path.

Figure 7:
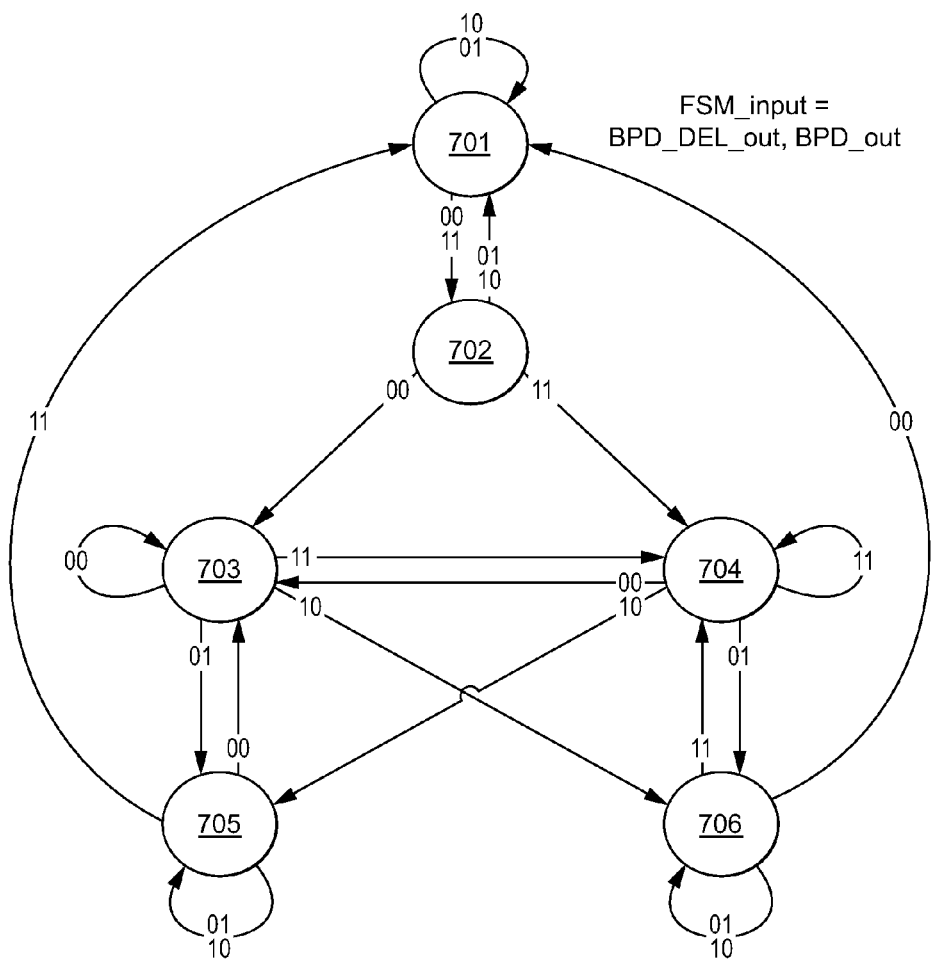
FIG. 7 shows a preferred state diagram employed by an adjustor in a preferred embodiment of the present invention.

The adjustor 603 may be configured to employ the state diagram illustrated in FIG. 7. The example shown in FIG. 7 is illustrative of the case in which two binary phase detectors are used to detect differences in the phase between the feedback signal and a reference signal (delayed and non-delayed respectively). At 701, the adjustor is in an initial state. The adjustor remains in the initial state until both phase detect signals PD1 and PD2 have the same value (either 00 or 11). When the adjustor detects that the phase detect signals PD1 and PD2 have the same value, the adjustor enters a pre-wait state 702. In the pre-wait state, if on the next clock value the adjustor detects that both phase detect signals PD1 and PD2 have the same value, the adjustor enters a state 703, 704 in which it waits to detect a commutation in one of the signals. Alternatively, when in pre-wait state 702 the adjustor detects that both phase detect signals PD1 and PD2 have different values (i.e. 01 or 10), the adjustor returns to initial state 701.

If the two phase detect signals PD1 and PD2 each have a value of 0, the adjustor enters wait 0 state 703. In wait 0 state 703, the adjustor is arranged to wait until a commutation occurs in the phase detect signals. So long as the phase detect signals PD1 and PD2 both have a value of 0, adjustor 603 remains in the wait 0 state 703. If the phase detect signal PD1 changes first, i.e. the adjustor notes that the phase detect signals PD1, PD2 have changed from 00 to 10, then adjustor 603 enters a frequency down state 706 in which it asserts a frequency down frequency control signal FREQ_CTRL is output. If the phase detect signal PD2 changes first, i.e. the adjustor notes that the phase detect signals PD1, PD2 have changed from 00 to 01, then adjustor 603 enters a frequency up state 705 in which a frequency up frequency control signal FREQ_CTRL is output. If both phase detect signals PD1 and PD2 change value at the same time i.e. from 00 to 11, then adjustor 603 enters wait 1 state 704 (described below).

If the two phase detect signals PD1 and PD2 both have a value of 1 in pre-wait state 702, the adjustor enters wait 1 state 704. In wait 1 state 704, the adjustor is arranged to wait until a commutation occurs in the phase detect signals. So long as the phase detect signals PD1 and PD2 have a value of 1, adjustor 603 remains in the wait 1 state 704. If the phase detect signal PD1 changes first, i.e. the adjustor notes that the phase detect signals PD1, PD2 have changed from 11 to 01, then adjustor 603 enters a frequency down state 706 in which it asserts a frequency down frequency control signal FREQ_CTRL is output. If the phase detect signal PD2 changes first, i.e. the adjustor notes that the phase detect signals PD1, PD2 have changed from 11 to 10, then adjustor 603 enters a frequency up state 705 in which a frequency up frequency control signal FREQ_CTRL is output. If both phase detect signals PD1 and PD2 change value at the same time i.e. from 11 to 00, then adjustor 603 enters wait 0 state 703 (described above).

The up and down frequency control signals FREQ_CTRL may be received by further circuitry in the PLL, such as state machine 607. Alternatively, the up and down frequency control signals FREQ_CTRL may be completely internal to the adjustor 603.

In frequency up state 705, the adjustor will continue to output the frequency up frequency control signal FREQ_CTRL until both phase detect signals PD1, PD2 have the same value. If phase detect signals PD1 and PD2 both have a value of 1, adjustor 603 returns to initial state 701. If phase detect signals PD1 and PD2 both have a value of 0, the adjustor re-enters wait 0 state 703.

In frequency down state 706, the adjustor will continue to output the frequency down frequency control signal FREQ_CTRL until both phase detect signals PD1, PD2 have the same value. If phase detect signals PD1 and PD2 both have a value of 0, adjustor 603 returns to initial state 701. If phase detect signals PD1 and PD2 both have a value of 1, the adjustor re-enters wait 1 state 703.

Other state machines can be implemented by the adjustor with the same aim of controlling the frequency of the feedback signal in response to a detected commutation in the phase to detect signals PD1, PD2.

The applicant hereby discloses in isolation each individual feature described herein and any combination of two or more such features, to the extent that such features or combinations are capable of being carried out based on the present specification as a whole in the light of the common general knowledge of a person skilled in the art, irrespective of whether such features or combinations of features solve any problems disclosed herein, and without limitation to the scope of the claims. The applicant indicates that aspects of the present invention may consist of any such individual feature or combination of features. In view of the foregoing description it will be evident to a person skilled in the art that various modifications may be made within the scope of the invention.

What is claimed is:

1. A phase locked loop, comprising:
   a signal generator arranged to output a feedback signal;
   a first phase detector arranged to detect a phase difference between the feedback signal and a reference signal and to output a first phase detect signal in dependence on that detection;
   a second phase detector arranged to detect a phase difference between the feedback signal and a delayed version of the reference signal or between the reference signal and a delayed version of the feedback signal and to output a second phase detect signal in dependence on that detection; and
   an adjustor arranged to determine which of the first and second phase detect signals commutes first and to alter the frequency of the feedback signal in dependence on the result of the determination.

2. A phase locked loop as claimed in claim 1 wherein the second phase detect signal indicates a phase difference between the feedback signal and a delayed version of the reference signal and the adjustor is arranged to: increase the frequency of the feedback signal when the adjustor determines that the first phase detect signal commutes first; and to decrease the frequency of the feedback signal when the adjustor determines that the second phase detect signal commutes first.

3. A phase locked loop as claimed in claim 1 wherein the second phase detect signal indicates a phase difference between the reference signal and a delayed version of the feedback signal and the adjustor is arranged to: decrease the frequency of the feedback signal when the adjustor determines that the first phase detect signal commutes first; and to increase the frequency of the feedback signal when the adjustor determines that the second phase detect signal commutes first.

4. A phase locked loop as claimed in claim 1 wherein the adjustor is arranged to determine which of the first and second phase detect signals commutes first by identifying a state in which the first and second phase detect signals are equal and by identifying which of the first and second phase detect signals is the first to commute from that state.

5. A phase locked loop as claimed in claim 4 wherein the adjustor is arranged to sample a respective sequence of values output by the first and second phase detectors in order to identify when the first and second phase detect signals are equal.

6. A phase locked loop as claimed in claim 1 wherein the adjustor is arranged to determine which of the first and second phase detect signals commutes first by examining respective sequences of commutations of the first and second phase detect signals.

7. A phase locked loop as claimed in claim 1 wherein the adjustor is further arranged to assert a lock signal for locking the phase locked loop when the adjustor determines that the frequency of the feedback signal has sequentially increased and decreased a predetermined number of times.

8. A phase locked loop as claimed in claim 1, further comprising an integral filter path arranged to either increase or decrease the frequency of the feedback signal in dependence on an output from the adjustor.

9. A phase locked loop as claimed in claim 8, wherein the adjustor is further arranged to assert a lock signal for locking the phase locked loop when the adjustor determines that the frequency of the feedback signal has sequentially increased and decreased a predetermined number of times and wherein the integral filter path is arranged to receive the lock signal.

10. A phase locked loop as claimed in claim 8 wherein the output from the adjustor is dependent on which phase signal commuted first.

11. A phase locked loop as claimed in claim 1, further comprising a proportional filter path arranged to receive the first phase detect signal and to control the frequency of the feedback signal in dependence thereon.

12. A phase locked loop as claimed in claim 2, wherein the phase of the delayed version of the reference signal is offset from the phase of the feedback signal by less than 180 degrees.

13. A phase locked loop as claimed in claim 1, wherein the adjustor further comprises memory cells arranged to detect when the first and second phase detect signals commute.

14. A phase locked loop as claimed in claim 1, wherein the phase locked loop is arranged to operate at a frequency higher than 10 GHz.

15. A phase locked loop as claimed in claim 1, wherein the first phase detector is a binary phase detector.

16. A phase locked loop as claimed in claim 1, wherein the second phase detector is a binary phase detector.

17. A phase locked loop as claimed in claim 1, wherein the signal generator is a voltage controlled oscillator or a digitally controlled oscillator.

18. A phase locked loop as claimed in claim 1 further comprising a feedback path having an integer-N divider.

19. A method for altering the frequency of a feedback signal comprising the steps of:
    detecting a phase difference between the feedback signal and a reference signal and outputting a first phase detect signal in dependence on that detection;
    detecting a phase difference between the feedback signal and a delayed version of the reference signal or between the reference signal and a delayed version of the feedback signal and outputting a second phase detect signal in dependence on that detection;
    determining which of the first and second phase detect signals commutes first; and
    altering the frequency of the feedback signal in dependence on the result of the determining step.

20. A method as claimed in claim 19, further comprising the steps of:
    decreasing the frequency of the feedback signal if the adjustor determines that the first phase detect signal commutes first; and
    increasing the frequency of the feedback signal if the adjustor determines that the second phase detect signal commutes first.

21. A method as claimed in claim 19, further comprising the steps of:
    determining that the frequency of the feedback signal has sequentially increased and then decreased a predetermined number of times; and
    asserting a lock signal as a result of this determination.

22. A method as claimed in claim 21 wherein the frequency of the feedback signal is only altered when no lock signal is being asserted.

23. A method as claimed in claim 19 wherein the step of determining which of the first and second phase detect signals commutes first includes the steps of:
    identifying a state in which the first and second phase detect signals are equal; and
    identifying which of the first and second phase detect signals is the first to commute from that state.

* * * * *

UNITED STATES PATENT AND TRADEMARK OFFICE
CERTIFICATE OF CORRECTION

PATENT NO. : 8,508,271 B1
APPLICATION NO. : 13/562813
DATED : August 13, 2013
INVENTOR(S) : Lamanna et al.

It is certified that error appears in the above-identified patent and that said Letters Patent is hereby corrected as shown below:

In the Specification

In Column 1, Line 48, delete "offset in to phase" and insert -- offset in phase --, therefor.

In Column 2, Line 64, delete "version of to the reference" and insert -- version of the reference --, therefor.

In Column 4, Line 38, delete "oscillating signal lags" and insert -- feedback signal leads --, therefor.

In Column 4, Line 41, delete "oscillating signal lags" and insert -- feedback signal leads --, therefor.

In Column 5, Line 19, delete "of to phase" and insert -- of phase --, therefor.

In Column 5, Line 63, delete "clock to data" and insert -- clock data --, therefor.

In Column 6, Line 38, delete "01110101" and insert -- 0111010 --, therefor.

In Column 5, Line 40, delete "sequentially to increased" and insert -- sequentially increased --, therefor.

In Column 7, Line 35, delete "BDP1" and insert -- BPD1 --, therefor.

In Column 7, Line 55, delete "BDP2" and insert -- BPD2 --, therefor.

In Column 7, Line 65, delete "BDP2." and insert -- BPD2. --, therefor.

In Column 8, Line 66, delete "the to feedback" and insert -- the feedback --, therefor.

Signed and Sealed this
Nineteenth Day of November, 2013

Teresa Stanek Rea
*Deputy Director of the United States Patent and Trademark Office*

CERTIFICATE OF CORRECTION (continued)
U.S. Pat. No. 8,508,271 B1

In Column 11, Line 1, delete "signal to FREQ_CTRL" and insert -- signal FREQ_CTRL --, therefor.

In Column 12, Line 21, delete "phase to detect" and insert -- phase detect --, therefor.